United States Patent [19]

Logan

[11] 4,226,667

[45] Oct. 7, 1980

[54] OXIDE MASKING OF GALLIUM ARSENIDE

[75] Inventor: Ralph A. Logan, Morristown, N.J.

[73] Assignee: Bell Telephone Laboratories, Incorporated, Murray Hill, N.J.

[21] Appl. No.: 956,392

[22] Filed: Oct. 31, 1978

[51] Int. Cl.$^2$ ............................................. H01L 21/308
[52] U.S. Cl. ..................................... 156/656; 148/187; 156/657; 156/662; 156/667; 204/56 R
[58] Field of Search ............... 156/655, 656, 657, 661, 156/662, 667, 664; 148/187; 204/56 R

[56] References Cited

U.S. PATENT DOCUMENTS

| | | | |
|---|---|---|---|
| 3,856,588 | 12/1974 | Hashimoto et al. | 148/188 |
| 3,890,169 | 6/1975 | Schwartz | 148/187 |
| 4,055,443 | 10/1977 | Stepanovich et al. | 148/187 |
| 4,058,413 | 11/1977 | Welch et al. | 148/187 |
| 4,116,722 | 8/1978 | Kamei et al. | 148/187 |

OTHER PUBLICATIONS

Ishii et al., "Influence . . . GaAs", Journal of Electrochem. Society, vol. 124, No. 11 (11/77), pp. 1784-1794.
Hunsperger, "Ion Implanted . . . GaAs", Solid State Electronics, vol. 18, pp. 349-353 (1975).

*Primary Examiner*—Jerome W. Massie
*Attorney, Agent, or Firm*—Michael J. Urbano

[57] ABSTRACT

The use of gallium arsenide as an electronic material is increasing in popularity. However, its utility for planar MOS technology is hindered by the fact that its native oxide stabilizes upon heating and becomes etch resistant. I have discovered that it is the vaporization of arsenic containing compounds in the oxide which renders the oxide insoluble. A technique is described wherein an inert capping layer is disposed on a layer of the native oxide prior to heat exposure. This prevents evaporation of arsenic, and both the capping layer and the oxide are capable of subsequent dissolution in a weak acid or base.

6 Claims, No Drawings

OXIDE MASKING OF GALLIUM ARSENIDE

TECHNICAL FIELD

The invention relates to fabrication of semiconductor devices and, more particularly, to gallium arsenide devices wherein the native oxide is employed in the fabrication.

BACKGROUND OF THE INVENTION

The success of silicon as an electronic material is partially due to the characteristics of its native oxide, silion dioxide. In particular, silicon has become a dominant semiconductor due to the ability of its native oxide to act as a readily etched diffusion mask in the formation of planar diffused transistors. Gallium arsenide is rapidly becoming a popular electronic material and is used extensively for various optical and microwave devices. Spitzer et al in *J. Electrochem. Soc.*, 121, No. 6, 820 (1974) have demonstrated that the native oxide of gallium arsenide can be used as a zinc diffusion mask. Unfortunately, the native oxide of gallium arsenide is heat sensitive. Upon exposure to heat, the oxide becomes inert to chemical dissolution. Attempts to remove the oxide usually damage the underlying crystal surface. While the oxide has been useful as an etching mask and for the surface passivation of lasers, the heat sensitivity limits its usefulness for high temperature manufacturing processes, such as diffusion steps wherein the temperature is typically in excess of 600° C. The heat stabilized oxide gives gallium arsenide added versatility as a semiconductor, but some means for preventing the stabilization, would be desirable.

SUMMARY OF THE INVENTION

We have found that an inert capping layer, such as an evaporated gold film, disposed on the native oxide of aluminum gallium arsenide ($Al_xGa_{1-x}As$, $0 \leq X \leq 1$) prior to heat exposure, prevents the oxide from becoming etch resistant. Both the capping layer and the oxide may be readily removed in a weak acid or base subsequent to heat treatment.

DETAILED DESCRIPTION

Although the following discussion is directed to gallium arsenide, the principle applies to aluminum gallium arsenide as well. The native oxide of gallium arsenide comprises an amorphous equimolar mixture of gallium oxide and arsenic oxide. We have found that its resistance to etching appears to correlate with the out diffusion of arsenic during heat-treatment when arsenic containing compounds vaporize from the oxide. For example, the native oxide of $Al_{0.4}Ga_{0.6}As$ when heated in hydrogen at 500° C. for a few minutes becomes insoluble in common acidic etchants such as hydrochloric or hydrofluoric and basic etchants such as amonium hydroxide or potassium hydroxide.

The procedure to be followed when one desires to maintain the solubility of the oxide for subsequent removal as part of a high temperature fabrication process basically comprises: forming a native oxide on the surface of an $Al_xGa_{1-x}As$ semiconductor body, capping the native oxide with an inert material, heating the body so formed in subsequent steps, and etching in a weak acid or base to remove both the capping layer and the oxide.

The native oxide may be conveniently formed by anodization in a technique such as described by R. A. Logan et al in *J. Electrochem. Soc.*, 120, 1385 (1973). Following anodization, a layer of inert material, such as a thin film of evaporated gold, is deposited on the oxide to serve as a capping layer to prevent vaporization of the arsenic containing compounds. Any inert material which can be deposited onto GaAs while the GaAs is at low temperature (less than 350° C.) so as not to cause stabilization of oxide is suitable. Furthermore, the material should be compatible with the ultimate device if it is to be incorporated therein. Examples of such materials would be silicon dioxide, silicon nitride and metals such as silver or platinum which are evaporated onto the gallium arsenide. At this point, the body so formed may be subjected to heat treatment, such as diffusion steps for creating planar diffused transistors. Furthermore, a completed device incorporating the body may operate at high temperatures without causing a change in the oxide's properties. The capping layer could also be used as an annealing encapsulant. The dual oxide and capping layer may be removed sequentially. A gold capping layer, for example, may be removed with an iodine etch ($KI + I_2 + H_2O$) and the gold-protected oxide will dissolve in a weak base or acid. Alternatively, both layers may be removed simultaneously by dissolving the underlying native oxide in a solution such as 1 N potassium hydroxide.

As an illustrative example, this technique can be used to form a GaAs planar diffused transistor made with oxide masking. An n-type wafer of GaAs may be anodized to form a native oxide layer and the native oxide may be covered with a film of evaporated gold. Using conventional photolithography and etching techniques, a window of GaAs is exposed by etching through the oxide and gold and is surrounded by an area of the dual oxide and gold which will become the base region. Using the dual oxide and gold layer as a mask, sulphur may be diffused through the window into the GaAs to create the transistor emitter, a highly doped n-layer of an area approximately coextensive with that of the window. The gold may then be removed by etching and the gold-protected oxide may then be dissolved in any weak base or acid to form a new window to the GaAs, of a larger area than the first formed window. The transistor base region may be formed by a second diffusion of zinc to form a p-type layer approximately coextensive with the second formed window, using diffusion conditions so that the level of zinc acceptors is less than the level of sulfur donors.

It is to be understood that the abovedescribed arrangements are merely illustrative of many specific embodiments which can be devised to represent application of the principles of the invention. Numerous and varied other arrangements can be devised in accordance with these principles by those skilled in the art without departing from the spirit and scope of the invention. In particular, various means of oxidizing gallium arsenide, such as thermal oxidation, plasma oxidation, and galvanic oxidation may be employed. Furthermore, various inert capping materials such as silicon nitride or silicon dioxide may be used as long as they are deposited onto the oxidized gallium arsenide by a low temperature process and are compatible with the other semiconductor processing steps, such as diffusion, annealing, etc.

I claim:

1. In a process of manufacturing an $Al_xGa_{1-x}As$ device which includes the formation of a layer of native oxide on the device that is to be selectively patterned subsequent to the heating of the device to a temperature at which the oxide becomes insoluble as a result of change in composition of the oxide and more resistant to selective patterning, the step of covering the native oxide with a capping material which prevents the change in composition during subsequent heating whereby selective patterning is facilitated.

2. In a process of manufacturing a semiconductor device, a method comprising:
 (a) firstly forming a native oxide layer on an $Al_xGa_{1-x}As$ ($0 \leq x \leq 1$) body;
 (b) secondly depositing a capping layer on said native oxide to prevent evaporation of arsenic in said native oxide during subsequent heating steps;
 (c) thirdly heating said body to a temperature at which the evaporation of arsenic from said native oxide would take place in the absence of said capping layer; and
 (d) finally etching to remove at least a portion of said capping layer and said oxide.

3. The process of claim 1 wherein step (b) comprises depositing a dielectric material selected from the group consisting of silicon dioxide and silicon nitride.

4. The process of claim 1 wherein step (b) comprises depositing a layer of an inert metal.

5. The process of claim 4 wherein said inert metal is gold.

6. The process of claim 1 wherein step (a) comprises anodic oxidation.

* * * * *